(12) United States Patent
Brick et al.

(10) Patent No.: US 11,041,603 B2
(45) Date of Patent: Jun. 22, 2021

(54) ILLUMINATION DEVICE AND METHOD FOR MANUFACTURING AN ILLUMINATION DEVICE

(71) Applicant: OSRAM Opto Semiconductors GmbH, Regensburg (DE)

(72) Inventors: Peter Brick, Regensburg (DE); Henning Rehn, Winterthur (CH)

(73) Assignee: OSRAM OLED GMBH, Regensburg (DE)

( * ) Notice: Subject to any disclaimer, the term of this patent is extended or adjusted under 35 U.S.C. 154(b) by 0 days.

(21) Appl. No.: 16/605,106

(22) PCT Filed: Apr. 26, 2018

(86) PCT No.: PCT/EP2018/060785
§ 371 (c)(1),
(2) Date: Oct. 14, 2019

(87) PCT Pub. No.: WO2018/197636
PCT Pub. Date: Nov. 1, 2018

(65) Prior Publication Data
US 2020/0158310 A1    May 21, 2020

(30) Foreign Application Priority Data

Apr. 27, 2017   (DE) .......................... 102017109083.5

(51) Int. Cl.
*G02B 1/113* (2015.01)
*G02B 5/00* (2006.01)
(Continued)

(52) U.S. Cl.
CPC .............. *F21V 5/008* (2013.01); *F21V 5/048* (2013.01); *F21V 15/01* (2013.01); *F21V 23/003* (2013.01);
(Continued)

(58) Field of Classification Search
CPC .......... F21V 5/008; F21V 5/048; F21V 15/01; F21V 23/00; F21V 23/003; F21Y 2115/30; F21Y 2103/10
See application file for complete search history.

(56) References Cited

U.S. PATENT DOCUMENTS 6,881,980 B1    4/2005  Ting
9,281,301 B2    3/2016  Haslbeck et al.
(Continued)

FOREIGN PATENT DOCUMENTS

DE    102010012712 A1    9/2011
DE    102011054232 A1    4/2013
(Continued)

*Primary Examiner* — Anabel Ton
(74) *Attorney, Agent, or Firm* — Slater Matsil, LLP (57) ABSTRACT

An illumination device and a method for producing an illumination device are disclosed. In an embodiment an illumination device includes a light emitting element and an optical device with a first lens and a second lens, wherein the light emitting element has an emission surface on a side facing the optical device, wherein the optical device is subordinated to the light emitting element in a radiation direction, wherein the first lens is arranged on a side of the optical device facing the light emitting element, wherein a material, which has a refractive index different from a material of the first lens, is arranged between the first lens and the light emitting element, wherein a first surface of the first lens facing the light emitting element has a radius of curvature of at least 200 mm and a second surface of the first lens facing away from the light emitting element has a radius of curvature of at least 200 mm, and wherein the first lens has a thickness of at least twice an edge length of the emission surface.

20 Claims, 8 Drawing Sheets

(51) Int. Cl.
*F21Y 115/30* (2016.01)
*H01L 25/075* (2006.01)
*H01L 33/62* (2010.01)
*F21V 5/04* (2006.01)
*F21V 15/01* (2006.01)
*F21V 5/00* (2018.01)
*F21V 23/00* (2015.01)
*F21Y 103/10* (2016.01)
*F21Y 115/10* (2016.01)
*F21V 9/30* (2018.01)
*H01L 27/15* (2006.01)

(52) U.S. Cl.
CPC .............. *G02B 1/113* (2013.01); *G02B 5/003* (2013.01); *F21V 9/30* (2018.02); *F21Y 2103/10* (2016.08); *F21Y 2115/10* (2016.08); *F21Y 2115/30* (2016.08); *H01L 25/0753* (2013.01); *H01L 27/153* (2013.01); *H01L 33/62* (2013.01)

(56) References Cited

U.S. PATENT DOCUMENTS

| | | | |
|---|---|---|---|
| 2011/0089449 | A1 | 4/2011 | Chou et al. |
| 2013/0094234 | A1* | 4/2013 | Kloos .................... F21S 41/24 362/511 |
| 2013/0234274 | A1 | 9/2013 | Kam et al. |
| 2014/0049943 | A1* | 2/2014 | Brick ...................... F21V 13/12 362/97.1 |
| 2017/0199450 | A1* | 7/2017 | Matsubara ........... G03B 21/142 |
| 2017/0284622 | A1* | 10/2017 | Rehn .................. G02B 19/0014 |

FOREIGN PATENT DOCUMENTS

| | | |
|---|---|---|
| DE | 102013110272 A1 | 3/2015 |
| EP | 2355194 A2 | 8/2011 |
| WO | 2012155984 A1 | 11/2012 |
| WO | 2014122626 A1 | 8/2014 |

\* cited by examiner

| 22 | | T [nm] |
|---|---|---|
| 22-1 | TiO2 | 109.11 |
| 22-2 | SiO2 | 160.09 |
| 22-3 | TiO2 | 25.29 |
| 22-4 | SiO2 | 161.09 |
| 22-5 | TiO2 | 98.17 |
| 22-6 | SiO2 | 161.84 |
| 22-7 | TiO2 | 33.76 |
| 22-8 | SiO2 | 172.93 |
| 22-9 | TiO2 | 40.1 |
| 22-10 | SiO2 | 175.12 |
| 22-11 | TiO2 | 42.53 |
| 22-12 | SiO2 | 84.92 |

ILLUMINATION DEVICE AND METHOD FOR MANUFACTURING AN ILLUMINATION DEVICE

This patent application is a national phase filing under section 371 of PCT/EP2018/060785, filed Apr. 26, 2018, which claims the priority of German patent application 102017109083.5, filed Apr. 27, 2017, each of which is incorporated herein by reference in its entirety.

BACKGROUND

German patent application DE 10 2013 110272 A1 describes an illumination device.

SUMMARY OF THE INVENTION

Embodiments provide an illumination device. Further embodiments provide a method of manufacturing an illumination device. Yet further embodiments provide an illumination device with improved efficiency. Moreover, embodiments provide an illumination device that can be used to illuminate an area with a particularly high contrast. Yet other embodiments provide a method of manufacturing such an illumination device.

The illumination device is, for example, a headlamp, in particular a vehicle headlamp, an illumination device which can be inserted in a headlamp, or a general illumination device, for example, to illuminate buildings or rooms. In particular, the illumination device may be part of a projector. This means that the illumination device can be used as a light source and/or imaging unit in a projector or other optical display device. The illumination device is configured to emit electromagnetic radiation during normal operation, in particular light in the visible wavelength range.

According to at least one embodiment, the illumination device comprises a light emitting element. For example, the light emitting element may comprise at least one radiation-emitting semiconductor chip. For example, the light emitting element may comprise at least one light emitting diode or at least one laser diode. The light emitting element is configured to generate light during normal operation. In particular, the light emitting element is a Lambert emitter.

In particular, the light emitting element may also include passive luminous materials, such as conversion materials, or reflective materials. For example, the light emitting element is a light emitting semiconductor chip which has a plurality of emission regions which can be operated separately from each other and/or the light emitting element may comprise a plurality of semiconductor chips which are arranged side by side in a lateral plane and can be operated separately from each other. Alternatively, the light emitting element is formed by a laser diode, where a conversion material is subordinated to the laser diode in radiation direction. When the light emitting element is used as intended, different regions of the conversion material, for example, can be illuminated one after the other by means of the laser diode. The conversion material is configured to convert the light emitted by the laser diode into light of a longer wavelength range.

According to at least one embodiment, the illumination device comprises an optical device. For example, at least a large part of the electromagnetic radiation emitted by the light emitting element passes through the optical device. In particular, the optical device is configured to influence electromagnetic radiation emitted by the light emitting element by refraction, diffraction and/or reflection. The optical device comprises at least a first optical element. For example, in addition to the first optical element, the optical device comprises other optical elements configured to influence electromagnetic radiation, in particular the electromagnetic radiation emitted by the light emitting element. In particular, the optical device comprises a second optical element. Furthermore, the optical device may comprise a third optical element. For example, the optical device may comprise only refractive optical elements which influence the electromagnetic radiation emitted by the light emitting element. Alternatively, the optical device may also include reflective and/or diffractive optical elements. For example, the first, second and third optical elements are each a lens. For example, the first optical element is a first lens, the second optical element is a second lens and the third optical element is a third lens.

According to at least one embodiment, the optical device is subordinated to the light emitting element in a radiation direction. For example, the radiation direction is the main radiation direction along which the intensity of the emitted light is at a maximum. For example, the main radiation direction is parallel to an optical axis of the optical device. For example, during normal operation, at least a large part of the electromagnetic radiation emitted by the light emitting element can pass through the optical device. In particular, at least 50%, preferably at least 70%, of the electromagnetic radiation emitted by the light emitting element passes through the optical device.

According to at least one embodiment, the first lens is arranged on a side of the optical device facing the light emitting element. The first lens may be the optical element of the optical device which is first passed by the electromagnetic radiation emitted by the light emitting element. For example, the first lens is directly subordinated to the light emitting element in the radiation direction, so that the emitted electromagnetic radiation does not pass through any other optical elements before it strikes the first lens.

According to at least one embodiment, between the first lens and the light emitting element a material is arranged which has a refractive index different from that of the material of the first lens. In particular, the first lens and the light emitting element are not in direct mechanical contact with each other. For example, the first lens and the light emitting element are mechanically fixed to each other by means of a connecting means. The connecting means then has a refractive index different from that of the lens. Alternatively, a gaseous material is arranged between the first lens and the light emitting element. In particular, air is arranged between the first lens and the light emitting element. Alternatively, gases such as argon and/or nitrogen may be arranged between the first lens and the light emitting element. In particular, the space between the first lens and the light emitting element is filled with a material which has a lower refractive index than the material with which the first lens is formed.

According to at least one embodiment of the illumination device, a first surface of the first lens facing the light emitting element has a radius of curvature of at least 200 mm and a second surface of the first lens facing away from the light emitting element has a radius of curvature of at least 200 mm. In particular, the radius of curvature of the first and second surfaces is at least 500 mm, in particular at least 1000 mm. For example, the first surface is a concave curved surface and the second surface is a convex curved surface. In particular, within the manufacturing tolerance, the first lens has an equal first radius of curvature on its entire first surface. In particular, within the manufacturing tolerance, the first lens has an equal second radius of curvature on its entire second surface.

According to at least one embodiment, the illumination device comprises a light emitting element and an optical device with a first lens, in which the optical device is subordinated to the light emitting element in a radiation direction, the first lens being arranged on a side of the optical device facing the light emitting element, a material having a different refractive index from the material of the first lens is disposed between the first lens and the light emitting element, and a first surface of the first lens facing the light emitting element has a first radius of curvature of at least 200 mm and a second surface of the first lens facing away from the light emitting element has a second radius of curvature of at least 200 mm.

An illumination device described here is based, among other things, on the following considerations. In order to adapt the radiation characteristic of a light emitting element and/or to illuminate an area as efficiently as possible by means of a light emitting element, an optical device is arranged downstream of the light emitting element.

The illumination device described here now makes use, among other things, of the idea of placing the first lens directly after the light emitting element. For example, the first lens is a refractive optical element with a particularly low surface curvature, so that it can be easily subordinated to the light emitting element. For example, the first lens can be subordinated to the light emitting element in the radiation direction instead of a cover glass or a protective glass.

Advantageously, such an illumination device has a particularly compact design, since the first lens of the optical device integrates both the function of a refractive optical element, which is part of an optical device, and the function of a cover glass.

According to at least one embodiment of the illumination device, the light emitting element has, on a side facing the optical device, an emission surface of an active or passive light emitting component through which electromagnetic radiation is emitted during intended operation. The emission surface can be, for example, the surface of a conversion material or the light emission surface of one or more light emitting components. Furthermore, the emission surface may comprise the surfaces of several light emitting components arranged side by side in a lateral plane. Alternatively, the emission surface can be the surface of a single light emitting component, which in particular comprises a plurality of light emitting regions that can be operated separately from each other, for example. In particular, the emission surface can be an imaginary surface, which is not necessarily formed as a continuous surface, but is composed of the surfaces of several emitting elements. For example, all surfaces of the light emitting element that face the optical device and emit electromagnetic radiation are at least partly located in the emission surface. For example, the emission surface is a rectangular, especially square, area. Alternatively, the emission surface can have the shape of any polygon. In particular, the emission surface has an edge length which is measured along one edge of the polygon.

According to at least one embodiment, the first lens has a thickness, whereby the thickness is at least twice as large as an edge length of the emission surface, in particular a largest edge length of the emission surface. The first lens may have a thickness measured along the optical axis of the optical device. The thickness of the first lens is at least twice as large, in particular at least three times as large, for example, at least five times as large, as the edge length, in particular the largest edge length, of the emission surface. For example, the thickness is at least 10 mm, in particular at least 20 mm. Advantageously, an aberration of the optical device, for example, can be compensated by adjusting the thickness of the first lens. Furthermore, a first lens with the mentioned thickness offers a particularly good protection of the light emitting element against environmental influences.

According to at least one embodiment of the illumination device, the first lens is formed with a material whose refractive index is at least 1.6. In particular, the first lens is formed exclusively with a material whose refractive index is at least 1.6, in particular at least 1.7. For example, the material of the first lens is heavy-flint glass such as N-SF11, NSF57HT, N-SF66, NSF57HT, N-SF57HT or a material with equivalent optical properties. In particular, the material of the first lens is lead-free glass. Advantageously, the optical properties of the optical device can be particularly well adapted by means of a first lens formed with such a material.

According to at least one embodiment of the illumination device, the first lens is formed with a material whose Abbe number is maximum 50. In particular, the material with which the first lens is formed has an Abbe number of maximum 40. It is advantageous that chromatic aberrations can be compensated particularly well by means of a first lens formed with a material with a low Abbe number.

According to at least one embodiment, due to the thickness of the first lens, the beam offset along the optical axis of the optical device at least partially compensates for spherical aberrations within the optical device. When passing through the first lens, the electromagnetic radiation emitted by the light emitting element can be refracted at the first and second surfaces. For example, different beams of light emitted from a common point on the emission surface strike the first surface of the first lens at a different angle to the optical axis of the optical device. Beams incident on the first surface at a greater angle to the optical axis have a greater offset along the optical axis after passing through the first lens due to refraction at the first and second surfaces than beams incident on the first surface at a smaller angle to the optical axis. The greater the thickness of the lens, the greater the difference in offset along the optical axis of beams incident at a different angle on the first surface of the lens. By adjusting the thickness of the first lens, the offset between the different beams emitted from a common point of the emission surface can be adjusted so that the spherical aberration generated by other optical elements of the optical device can be compensated. Advantageously, adjusting the thickness of the first lens allows compensation of the spherical aberration.

According to at least one embodiment of the illumination device, the first surface and/or the second surface are plane. If the first surface and/or the second surface are plane, they have an infinite radius of curvature within the manufacturing tolerance. For example, the plane surfaces are perpendicular to the optical axis of the first lens. Advantageously, plane surfaces are particularly easy and precise to produce. Furthermore, the first lens can easily be aligned to the light emitting element, since distances can be adjusted very precisely by means of plane surfaces.

According to at least one embodiment of the illumination device, the first and second surfaces are parallel to each other. In particular, the first and second surfaces have an infinite radius of curvature so that both surfaces are plane. Advantageously, a first lens with a plane first and a plane second surface can be aligned relative to the light emitting element in a particularly simplified way. In particular, a lateral offset of the first lens—transverse or perpendicular to the optical axis of the first lens—relative to the light emitting element does not degrade the imaging performance of the optical device.

According to at least one embodiment of the illumination device, an angle between a main beam and the optical axis is at most 2° on the side of the optical device on which the light emitting element is arranged. The optical device may be an optical device telecentrically formed on the side facing the light emitting element. For example, each point on the emission surface has a main beam which is approximately parallel to the optical axis of the optical device before this main beam strikes the first surface of the first lens. Advantageously, a telecentric optical device allows a particularly high contrast in the illumination of different regions by means of the illumination device.

According to at least one embodiment of the illumination device, the numerical aperture of the optical device is at least 0.5. In particular, the numerical aperture of the optical device is at least 0.7. Advantageously, a large numerical aperture of the optical device allows a particularly large proportion of the electromagnetic radiation emitted by the light emitting element to be used for illumination by means of the illumination device.

According to at least one embodiment, the distance between the emission surface and the first surface is at most the length of the edge length of the emission surface. In particular, the distance between the emission surface and the first surface does not exceed half the length of the edge length of the emission surface. For example, the distance between the emission surface and the first surface is a maximum of 1 mm, in particular a maximum of 0.5 mm. Advantageously, a particularly small distance between the light emitting element and the first lens enables a particularly large proportion of the electromagnetic radiation emitted by the light emitting element to pass through the optical device and thus be used for illumination.

According to at least one embodiment of the illumination device, a second lens is arranged on a side of the optical device facing away from the light emitting element, wherein the second lens is formed with a material whose Abbe number is greater than 55. The material with which the second lens is formed may be a material with a low glass transition temperature. For example, the material of the second lens has a glass transition temperature of at most 550° C. In particular, the second lens is formed with one of the following materials: Crown glass, Borosilicate glass, Soda-lime glass, B270, P-BK7, Doctan, PMMA, Zeonex F52R. In particular, the second lens can be formed as a pressed glass lens or with pressed plastic. Such a second lens is particularly cost-effective and easy to manufacture. In particular, the second lens can be an aspherical lens with which an anamorphic imaging optical device is realized.

The second lens can have a larger diameter than the first lens. The diameter of the lenses is measured perpendicular to the optical axis of the lenses. In particular, the luminance of the electromagnetic radiation emitted by the light emitting element in the second lens is lower than in the first lens when the light emitting element is operated as intended. Advantageously, the larger second lens can be formed with a cheaper material than the first lens.

According to at least one embodiment of the illumination device, the light emitting element is arranged in a housing, the housing and the first lens being mechanically fixedly connected to each other. For example, the housing completely surrounds the light emitting element in lateral directions. In particular, the light emitting element is cohesively connected to the housing. For example, the light emitting element is mechanically fixed to the housing on a side facing away from the optical device. For example, the housing surrounds the light emitting element from all sides that are not facing the optical device. The housing is formed, for example, with an epoxy material, a silicone material, a plastic, a printed circuit board and/or a glass material.

The first lens can be mechanically fixed to the housing by means of a frictional, a positive and/or a cohesive connection. For example, the frictional connection is realized by means of a clamping device. Alternatively or additionally, the housing and the first lens can be cohesively connected by means of adhesive bonding, bonding or a glass solder. In particular, the region in which the first lens is in direct contact with the housing does not overlap with the emission surface in a vertical direction, perpendicular to the lateral direction. Advantageously, the direct connection of the first lens and the housing enables a particularly robust and compact design of the illumination device.

According to at least one embodiment of the illumination device, a gaseous material, in particular air, is arranged between the emission surface and the first surface. For example, no potting material is arranged on the side of the light emitting element facing the first lens. In particular, the light emitting element is surrounded by a potting material at most or only in lateral directions. Advantageously, the transition from air to the material of the first lens allows a particularly strong refraction of the electromagnetic radiation emitted by the light emitting element at the boundary surface of the first lens.

According to at least one embodiment of the illumination device, the first lens has an anti-reflection layer on its first and/or second surface. The anti-reflective layer, for example, is a layer with a constant thickness. For example, the anti-reflective layer is formed with magnesium fluoride, silicon dioxide ($SiO_2$), titanium dioxide ($TiO_2$) or aluminum oxide (AlO). Advantageously, a particularly small proportion of the electromagnetic radiation emitted by the light emitting element is reflected by the first or second surface of the first lens.

According to at least one embodiment of the illumination device, the first lens is at least partially coated with an absorption layer. In particular, the first lens is coated with an absorption layer on its side surfaces, which run transversely to the first and second surfaces of the first lens and interconnect them. The absorption layer is configured to absorb electromagnetic radiation, in particular that generated by the light emitting element. The absorption layer may also be partially located on the first and/or second surface of the first lens. In particular, an aperture of the optical device can be formed by means of the absorption layer. It is advantageous that the absorption layer absorbs part of the electromagnetic radiation, which reduces the contrast of the illumination.

According to at least one embodiment of the illumination device, the light emitting element comprises a pixelated light emitting semiconductor chip or the light emitting element comprises a plurality of light emitting semiconductor chips. For example, a pixelated semiconductor light emitting chip comprises a plurality of light emitting regions that can be operated separately from each other. In particular, the light emitting regions are arranged side by side in a lateral plane. For example, the light emitting regions are arranged next to each other in a lateral plane at the nodes of a regular rectangular grid. For example, the individual light emitting regions of the light emitting semiconductor chip are manufactured in a common process and, for example, have similar active zones. In particular, the individual light emitting region is configured to generate electromagnetic radiation from a common color location during intended operation. In particular, the light emitting regions may have a conversion material which is configured to convert the electromagnetic radiation generated in the light emitting regions into electromagnetic radiation of a longer wavelength range. The emission surface of the light emitting element may include all light emitting regions of the pixelated light emitting semiconductor chip.

Alternatively, the light emitting element may include a plurality of semiconductor light emitting chips. In particular, the light emitting semiconductor chips may be non-pixelated. For example, the light emitting semiconductor chips can be controlled separately from each other. In particular, the light emitting semiconductor chips are not manufactured in a common process. For example, the light emitting semiconductor chips are configured to generate electromagnetic radiation of different color locations during intended operation. The emission surface of the light emitting element can include all light emitting semiconductor chips.

In particular, a pixelated light emitting semiconductor chip comprises at least 16, in particular at least 1024, emission regions. Alternatively, the light emitting element comprises at least 16, in particular at least 1024, light emitting semiconductor chips. The light emitting semiconductor chips may be arranged in a lateral plane at the nodes of a regular rectangular grid. For example, each light emitting semiconductor chip or each light emitting region of a pixelated semiconductor chip has an edge length of at least 0.5 µm to a maximum of 500 µm.

Advantageously, a selective illumination of individual areas can be realized by means of an illumination device which has such a light emitting element with several separately controllable semiconductor chips or with a pixelated semiconductor chip.

According to at least one embodiment of the illumination device, the light emitting element is cohesively connected to a drive device. For example, the drive device is arranged on a side of the light emitting element facing away from the optical device. In particular, the drive device is located between the light emitting element and the housing. The drive device and the light emitting element can, for example, be cohesively mechanically connected to each other. In particular, the light emitting element and the drive device may be electrically and mechanically connected to each other by means of a conductive adhesive or a solder.

For example, the drive device is configured to electrically conductively contact with the light emitting element and to supply it with current during normal operation. In particular, the drive device is configured to control and operate the light emitting element by means of a pulse-width modulated signal. The drive device can be a microcontroller, for example, in the form of a silicon chip. In particular, the drive device may include a driver for the light emitting element. In particular, the drive device comprises an interface through which data can be transmitted to the drive device or data can be read from the drive device and/or the light emitting element. Furthermore, the drive device may comprise, for example, a memory, in particular a register.

Furthermore, the drive device and the light emitting element may be electrically and mechanically connected to each other by means of another passive element. The other passive element may, for example, be arranged to electrically connect the drive device to individual electrical contacts of the light emitting element. The advantage of integrating a drive device into the illumination device is that it enables a particularly compact design of the illumination device.

According to one embodiment, the emission surface is formed with a dielectric layer structure. The dielectric layer structure is arranged directly on the semiconductor chip or on the conversion material. The layered structure is formed by a plurality of dielectric layers. The dielectric layers are formed, for example, with silicon dioxide (SiO2) or titanium dioxide (TiO2). The dielectric layers formed with silicon oxide and titanium oxide are arranged alternately. For example, the layer structure comprises at least 5, preferably at least 10 dielectric layers. For example, the layer thickness of the dielectric layers is between 40 nm and 180 nm.

The dielectric layer structure forms a Bragg mirror which is configured to reflect electromagnetic radiation depending on its exit angle from the semiconductor chip. The exit angle is measured relative to the normal on an exit surface. The exit surface is the surface of the semiconductor chip through which at least a large part of the emitted electromagnetic radiation exits the semiconductor chip. In particular, the emitting surface comprises a facet of the semiconductor chip. For example, the reflectivity of the dielectric layer structure increases with increasing exit angle.

Advantageously, the dielectric layer structure increases the accumulated luminous flux for exit angles smaller than 45° and decreases it for exit angles larger than 45°. In other words, the layer structure increases the luminous flux of electromagnetic radiation with small exit angles and reduces the luminous flux of electromagnetic radiation with large exit angles.

A method of manufacturing an illumination device is furthermore given. In particular, the method can be used to produce an illumination device as described here. This means that all the features disclosed for the illumination device are also disclosed for the method and vice versa.

According to at least one embodiment of the method for manufacturing an illumination device, the method comprises a step A) in which light emitting elements are provided. The light emitting elements are, for example, Lambert emitters which are configured to generate electromagnetic radiation during normal operation. For example, the light emitting elements are each cohesively connected to a drive device.

According to at least one embodiment of the method for manufacturing an illumination device, the light emitting elements are each arranged in a first composite of housings in process step B). For example, the composite of housings comprises a plurality of housings arranged side by side in a lateral plane. In particular, the light emitting elements are mechanically cohesively connected to the composite housings. The light emitting elements can be mechanically fixedly connected to the composite of housings by means of a soldering process or an adhesive process. For example, in process step B) exactly one light emitting element is arranged in each housing of the composite of housings.

According to at least one embodiment of the method for manufacturing an illumination device, a plurality of first lenses are provided in a second composite in process step C). For example, the first lenses are arranged side by side in a lateral direction within the second composite. In particular, the second laminate is a glass sheet with two plane-parallel surfaces. For example, the thickness of the second composite perpendicular to its main direction of extension is the same as the thickness of the first lens.

According to at least one embodiment of the method for manufacturing an illumination device, the first and second composites are joined together in a cohesive manner in process step D). For example, the first and second composites are joined mechanically by means of an adhesive bonding process, a glass soldering process or a soldering process.

According to at least one embodiment of the method for producing an illumination device, the first and second composites are separated in a process step E), whereby after separation exactly one lens and one housing are assigned with each light emitting element. For example, the first and second composites are separated by means of a sawing process, an etching process or a laser cutting process. In particular, the first and second composites are separated in a common process step.

According to at least one embodiment of the method for manufacturing an illumination device, further optical components of the optical device are arranged in the radiation direction of the light emitting elements. For example, second and/or third lenses are subordinated to the light emitting elements of the first lens in the radiation direction.

According to at least one embodiment of the method for manufacturing an illumination device, an illumination device described here is manufactured by means of the method.

BRIEF DESCRIPTION OF THE DRAWINGS

Advantageous embodiments and developments of the illumination device will become apparent from the exemplary embodiments described below in combination with the figures.

In the figures:

FIGS. 3A, 3B, 3C, 3D and 3E schematically represent different stages of a method for manufacturing an illumination device;

In the exemplary embodiments and figures, similar or similarly acting constituent parts are provided with the same reference symbols. The elements illustrated in the figures and their size relationships among one another should not be regarded as true to scale. Rather, individual elements may be represented with an exaggerated size for the sake of better representability and/or for the sake of better understanding.

DETAILED DESCRIPTION OF ILLUSTRATIVE EMBODIMENTS

Figure 1:
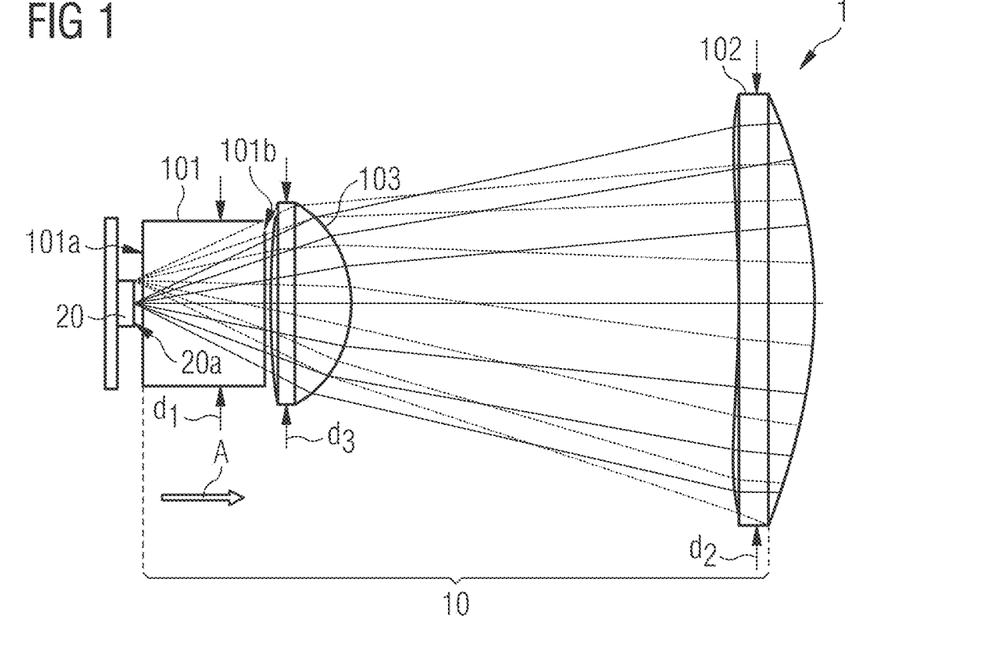
FIGS. 1 and 3D show schematic sectional views of an illumination device.

FIG. 1 shows a schematic sectional view of an illumination device 1 described here comprising a light emitting element 20 and an optical device 10 with a first lens 101. The optical device 10 is arranged downstream of the light emitting element 20 in a radiation direction A. The first lens 101 is arranged on a side of the optical device 10 facing the light emitting element 20. A second lens 102 is arranged on a side of the optical device 10 facing away from the light emitting element 20. A third lens 103 is arranged between the first lens 101 and the second lens 102. During normal operation, the light emitting element emits 20 electromagnetic radiation which passes through the first 101, the third 103 and the second 102 lens of the optical device 10 in this order.

The light emitting element 20 is a Lambert emitter. For example, the light emitting element comprises a pixelated light emitting semiconductor chip or a plurality of light emitting semiconductor chips that can be driven separately from each other. Alternatively, the light emitting element 20 comprises a laser with a conversion material subordinated in the beam path.

Between the first lens 101 and the light emitting element 20 there is arranged a material having a refractive index different from the material of the first lens 101. In particular, the material disposed between the light emitting element 20 and the first lens 101 has a lower refractive index than the material of the first lens. For example, a gaseous material, in particular argon, air or nitrogen, is arranged between the light emitting element 20 and the first lens 101. In particular, the distance of the light emitting element from the first lens is at most the length of the edge length K of the emission surface 20a.

A first surface 101a of the first lens 101 facing the light emitting element 20 has a radius of curvature of at least 200 mm. In particular, the first surface 101a is concave curved or plane. A second surface 101b of the first lens 101 facing away from the light emitting element 20 has a radius of curvature of at least 200 mm. In particular, the second surface 101b is convexly curved or plane.

In particular, the first surface 101a and/or the second surface 101b are plane. For example, the first surface 101a runs parallel to the second surface 101b.

The third lens 103 is a biconvex lens. Alternatively, the third lens 103 can have any other curvature. For example, the third lens is formed with F52R Zeon.

The second lens 102 is an aspherical lens. For example, an anamorphic image of the light emitting element is obtained with the second lens 102. The second lens, for example, is formed with F52R Zeon.

The diameter d3 of the third lens 103 is larger than the diameter d1 of the first lens 101. The diameter d2 of the second lens 102 is larger than the diameter d1 of the first lens 101. In particular, the diameter d2 of the second lens is 54 mm.

Figure 2A:
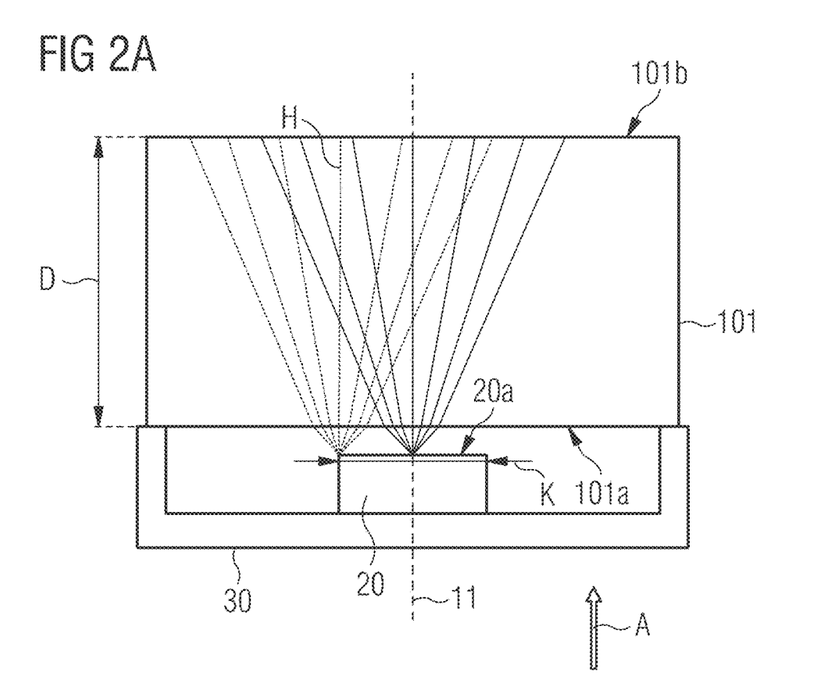
FIGS. 2A, 2B, 2C, 2D and 2E show schematic sectional views of a light emitting element, a housing and a first lens forming part of an illumination device.

FIG. 2A shows a schematic sectional view of a light emitting element 20, a housing 30 and a first lens 101 of an illumination device 1 described here. The light emitting element 20 is arranged in the housing 30. In particular, the light emitting element 20 is mechanically fixed to the housing 30 on its side facing away from the first lens 101. For example, the light emitting element 20 is connected to the housing 30 by means of a solder connection or an adhesive connection. On the side of the light emitting element 20 facing the first lens 101, the light emitting element 20 has an emission surface 20a. During normal operation, the light emitting element 20 emits electromagnetic radiation L generated in the light emitting element 20 through the emission surface 20a. The emission surface 20a has an edge length K in lateral direction. For example, the edge length K is 4 mm.

The first lens 101 is subordinated to the light emitting element 20 in radiation direction A. The first lens 101 has a thickness D along an optical axis 11 of the first lens 101. The thickness D of the first lens 101 is at least twice as large as the edge length K of the emission surface 20a. In particular, the thickness D is at least three times as large as the edge length K. For example, the thickness D is 15 mm. The thickness D of the first lens 101 is measured along the optical axis 11 from the first surface 101a to the second surface 101b. In particular, the thickness D of the first lens 101 is chosen in such a way that the beam offset along the optical axis 11 of the optical device 10 at least partially compensates for spherical aberrations that occur in the optical device 10.

For example, the first lens is formed with a material whose refractive index is at least 1.6. In particular, the Abbe number of the material with which the first lens 101 is formed is at most 50, in particular at most 40. For example, the first lens 101 is formed with a heavy-flint glass, in particular N-SF11, NSF57HT or N-SF66.

Figure 2B:
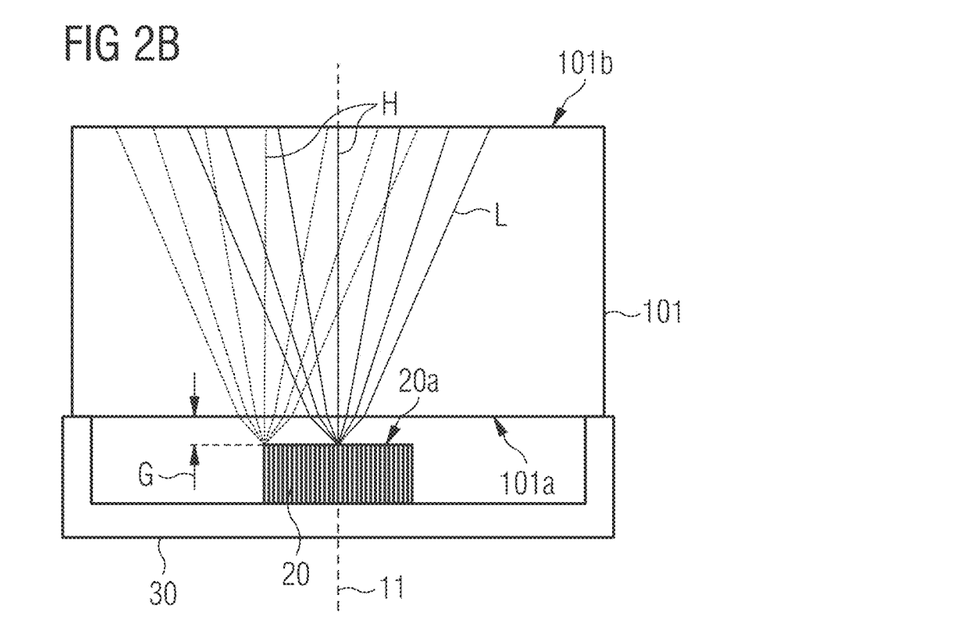

FIG. 2B shows a sectional view of a housing 30 of a light emitting element 20 and a first lens 101 of an illumination device 1. The light emitting element 20 has several emission regions which are, for example, part of a common pixelated semiconductor chip. In particular, the individual emission regions of the light emitting element 20 are produced in a common process. For example, the emission regions of the light emitting element emit electromagnetic radiation from the same color location. The emission regions each have an edge length of at least 0.5 μm to a maximum of 500 μm in the lateral direction. For example, the light emitting element comprises at least 16 emission regions, in particular at least 1024 emission regions, which are arranged side by side in a lateral plane at the nodes of a regular rectangular grid.

In particular, electromagnetic radiation emitted from different points of the emission surface 20a has different main beams H. The main beams H run substantially parallel to the optical axis 11 of the optical device 10 between the emission surface 20a and the first surface 101a. In particular, an angle between the optical axis 11 and a main beam H is at most 2°. For example, the optical device 10 is an optical system which is telecentric on the side of the light emitting element.

In particular, a maximum distance G between the emission surface 20a and the first surface 101a is 1 mm. Furthermore, the optical device 10 has a numerical aperture of at least 0.5, in particular of at least 0.7. For example, the optical device 10 is traversed by at least 50%, preferably at least 70%, of the electromagnetic radiation L emitted by the light emitting element 20.

Figure 2C:
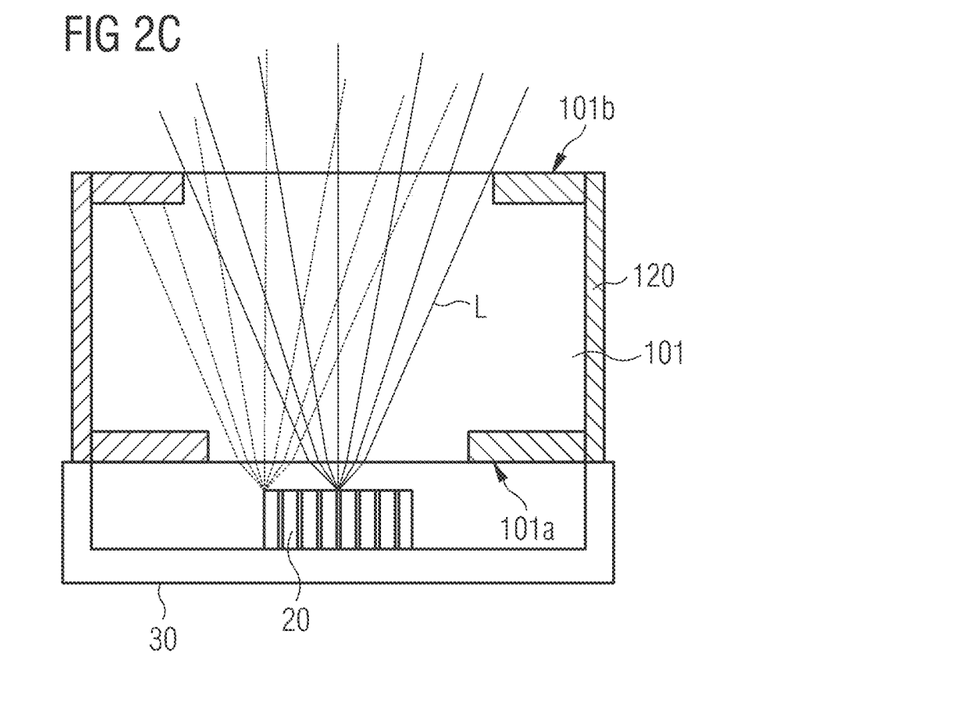

FIG. 2C shows a sectional view of a housing 30, a light emitting element 20 and a first lens 101. The housing 30 and the first lens 101 are mechanically fixed to each other. For example, the housing 30 and the first lens 101 are mechanically cohesively fixed to each other. In particular, the first lens 101 and the housing 30 are mechanically cohesively connected to each other by means of a glass soldering process, a soldering process or an adhesive process.

The first lens 101 is at least partially coated with an absorption layer 120. The absorption layer 120 covers at least the side surfaces of the first lens 101, which connect the first surface 101a and the second surface 101b with each other. In addition, the absorption layer can partially cover the first surface 101a and the second surface 101b. The absorption layer 120 is configured to absorb electromagnetic radiation L emitted by the light emitting element. In particular, the absorption layer 120 does not reflect electromagnetic radiation emitted by the light emitting element 20.

For example, the light emitting element 20 may comprise a plurality of light emitting semiconductor chips, such as light emitting diode chips, arranged in a lateral plane side by side at the nodes of a regular rectangular lattice. In particular, the light emitting semiconductor chips of the light emitting element 20 are configured to generate electromagnetic radiation of a different color location during intended operation. For example, in the lateral direction, the edge length of a light emitting semiconductor chip is at least 0.5 μm and a maximum of 500 μm. In particular, the individual semiconductor chips may contain conversion materials 21 which are arranged to convert electromagnetic radiation generated in the semiconductor chips into electromagnetic radiation of a longer wavelength range. Alternatively, a common conversion material 21 may be arranged downstream of the semiconductor chips in the radiation direction, which is arranged to convert the electromagnetic radiation generated in the semiconductor chips into electromagnetic radiation of a longer wavelength range.

Figure 2D:
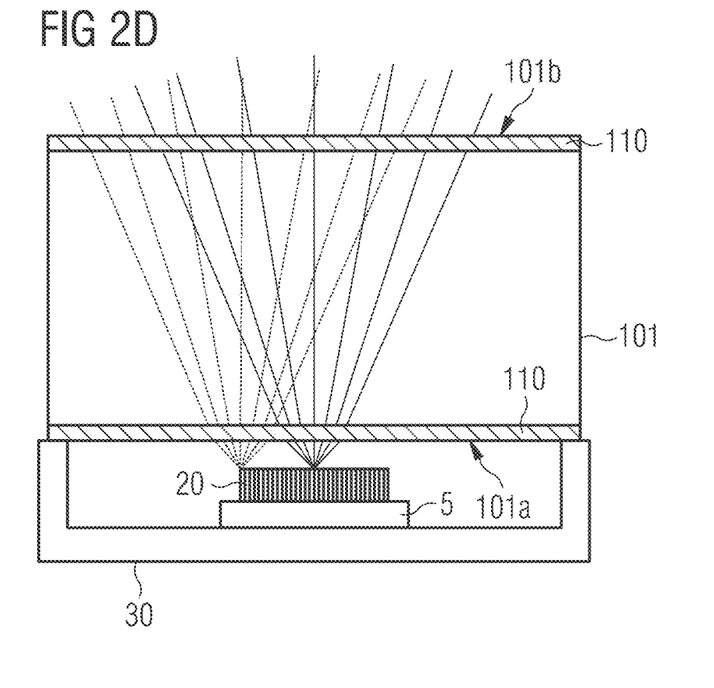

FIG. 2D shows a schematic cross-sectional view of a light emitting element, a housing 30, a first lens 101 and a drive device 5. The drive device 5 is arranged on the side of the light emitting element 20 facing away from the first lens 101. In particular, the light emitting element 20 is mechanically connected to the housing 30 by means of the drive device 5. The drive device 5 is configured to control and operate the light emitting element 20 during its intended use. For example, the drive device 5 comprises an interface via which the drive device 5 can receive and/or transmit data. In particular, the drive device 5 comprises a memory. For example, control data for operating the light emitting element is stored in the memory.

Further, the first lens comprises an anti-reflection layer on the first surface 101a and on the second surface 101b. The anti-reflection layer 110 is formed, for example, with magnesium fluoride. The anti-reflection layer 110 reduces the reflection of electromagnetic radiation generated in the light emitting element at the first 101a and second 101b surfaces. It is advantageous that the contrast of the illumination device 1 is increased by means of the anti-reflection layer 110.

Figure 2E:
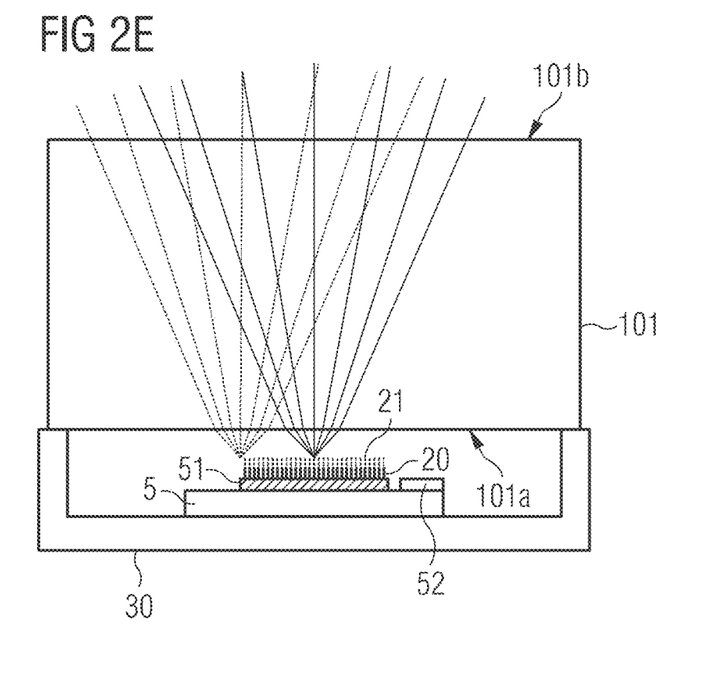

FIG. 2E shows a sectional view of a first lens 101, a housing 30, a light emitting element 20 and a drive device 5. The light emitting element 20 comprises a conversion material 21 which is configured to convert electromagnetic radiation emitted from a semiconductor chip 200 into electromagnetic radiation of a wavelength range with larger wavelengths. The light emitting element 20 and the drive device 5 are mechanically connected to each other by means of a contact structure 51. The contact structure is further adapted to electrically interconnect the light emitting element 20 and the drive device 5. The drive device 5 also comprises an interface 52 via which the drive device 5 can be electrically conductively contacted. For example, data can be transmitted to drive device 5 or data can be read out from drive device 5.

Figure 3A:
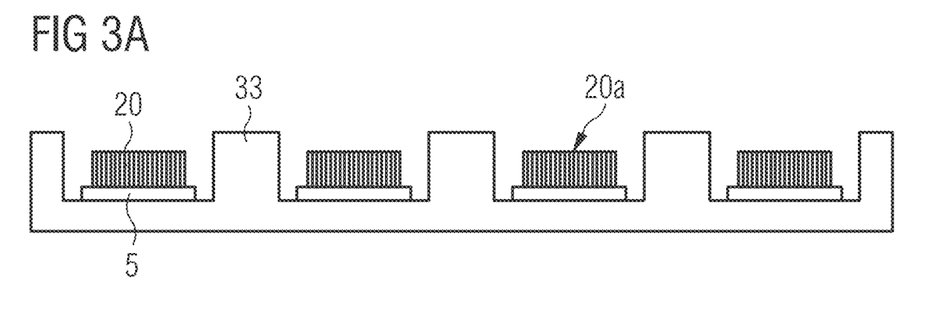

FIG. 3A shows a method for manufacturing an illumination device after performing a step A) in which light emitting elements 20 have been provided. The light emitting elements 20 are each arranged on a drive device 5. In a further process step B), the light emitting elements 20 were arranged in a first composite 33 of housings 30. The first composite 33 of housings 30 has a plurality of recesses in which the light emitting elements 20 are arranged. Thus, the light emitting elements 20 are not covered by one assigned housing only at their emission surface 20a.

Figure 3B:
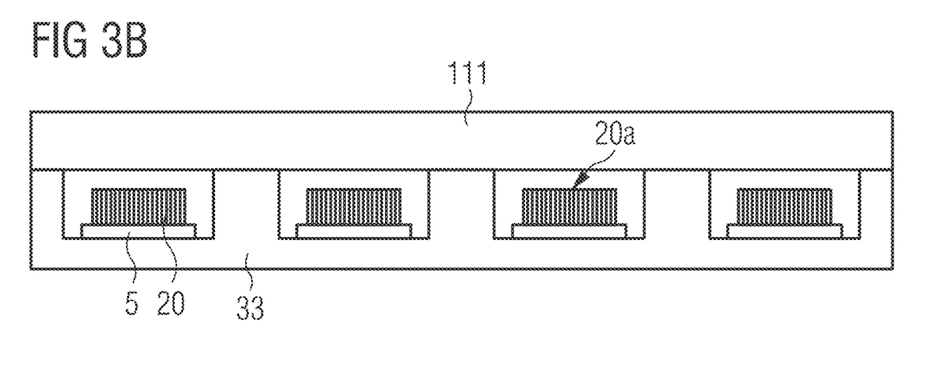

FIG. 3B shows a method for manufacturing an illumination device after process steps C) and D) have been carried out. In process step C), a plurality of first lenses 101 were provided in a second composite 111. The first 101 lenses are arranged next to each other in a lateral plane and are in direct contact with each other. In the process step D), the first compound 33 and the second compound 111 were mechanically connected to each other. In particular, the second compound 111 of the first lenses 101 is arranged on the side of the emission surface 20a of the light emitting element 20. The first compound 33 and the second compound 111 are cohesively bonded together using an adhesive process, a soldering process or a bonding process, for example.

Figure 3C:
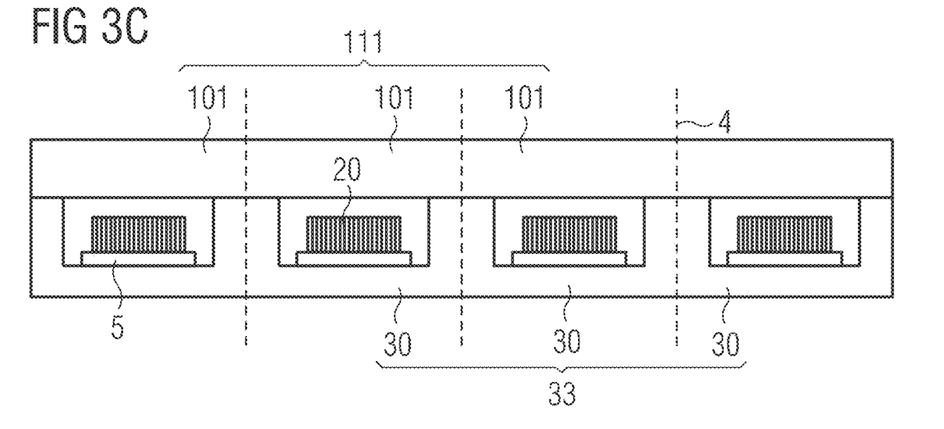

FIG. 3C shows how the housings 30 and the first lenses 101 are separated along separating lines 4 in a process step E). For example, the first lenses 101 and the housings 30 are separated in a common process step. For example, the first compound 33 and the second compound 111 are separated using a sawing process, an etching process or a laser cutting process.

Figure 3D:
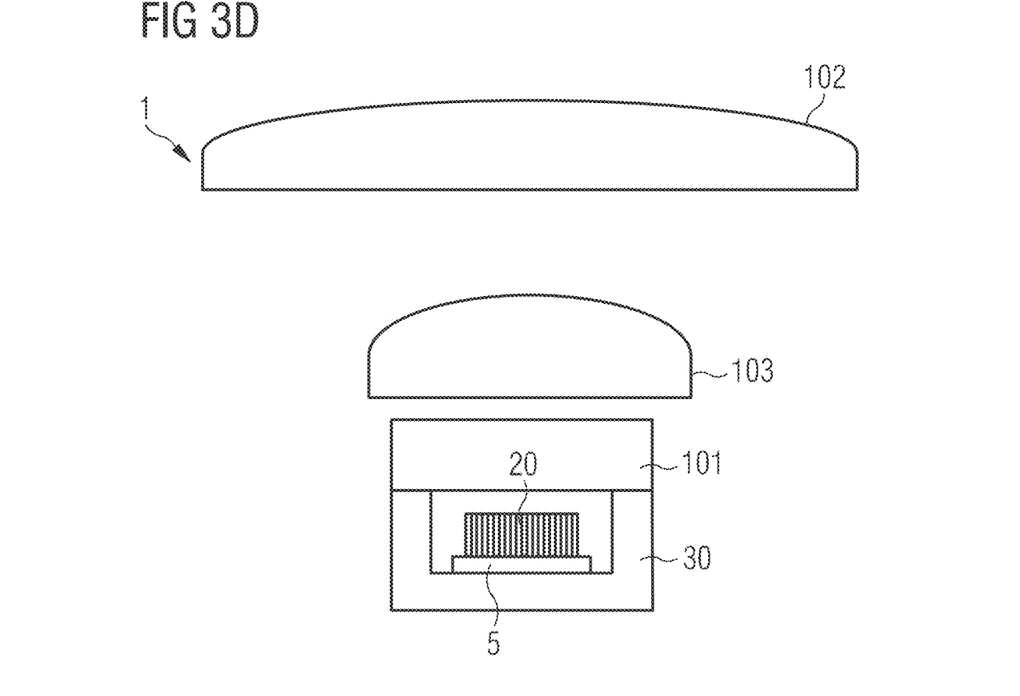

FIG. 3D shows the method for manufacturing an illumination device after a process step F), in which further optical components of the optical device are arranged downstream in the radiation direction of the light emitting elements 20. In particular, a second lens 102 and a third lens 103 are arranged on the side of the first lens 101 facing away from the light emitting element 20. For example, the second lens 102 and/or the third lens 103 are formed with a material whose Abbe number is greater than 55. In particular, the second lens 102 and/or the third lens 103 are formed with a material having a low glass transition temperature. For example, the glass transition temperature of the material of the second lens 102 and or of the third lens 103 is less than 550° C. For example, the second lens 102 and or the third lens 103 are formed with one of the following materials: Crown glass, Borosilicate glass, Soda-lime glass, B270, P-BK7, Doctan, PMMA, Zeonex F52R.

Figure 3E:
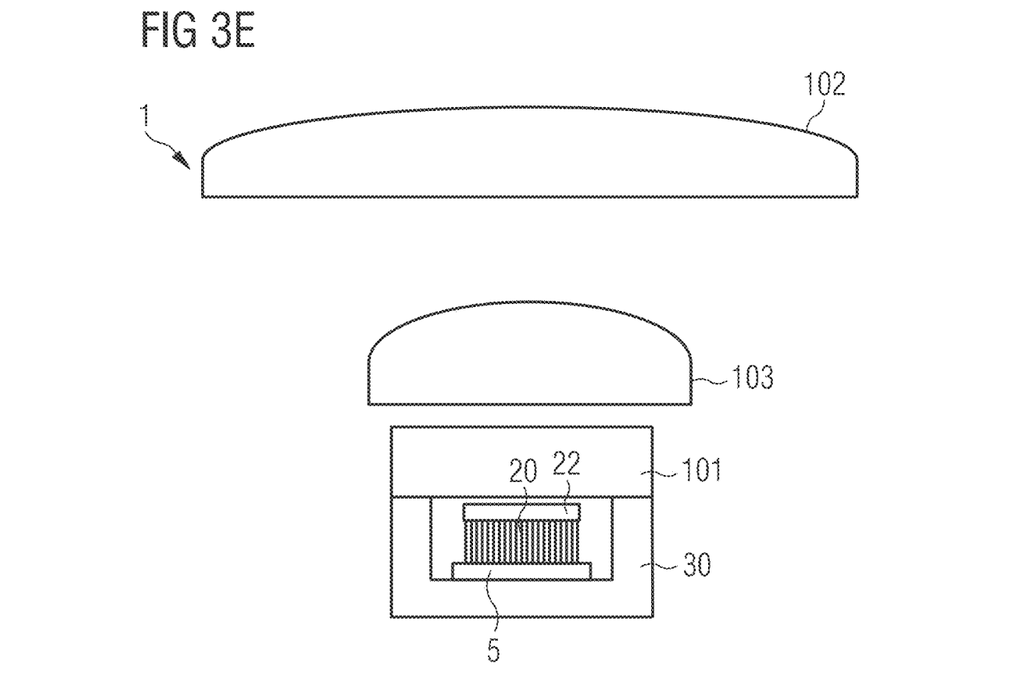

FIG. 3E shows an alternative embodiment form to the one shown in FIG. 3D, in which the light emitting element 20 additionally comprises a dielectric layer structure 22. The dielectric layer structure 22 is arranged at the exit surface of the semiconductor chip. In particular, the dielectric layer structure 22 forms the emission surface of the light emitting element 20. The dielectric layer structure 22 forms a Bragg mirror which reflects electromagnetic radiation L as a function of its exit angle W. For example, the greater the exit angle W of the electromagnetic radiation, the greater the reflectivity of the dielectric layer structure 22 for electromagnetic radiation L.

Figure 4A:
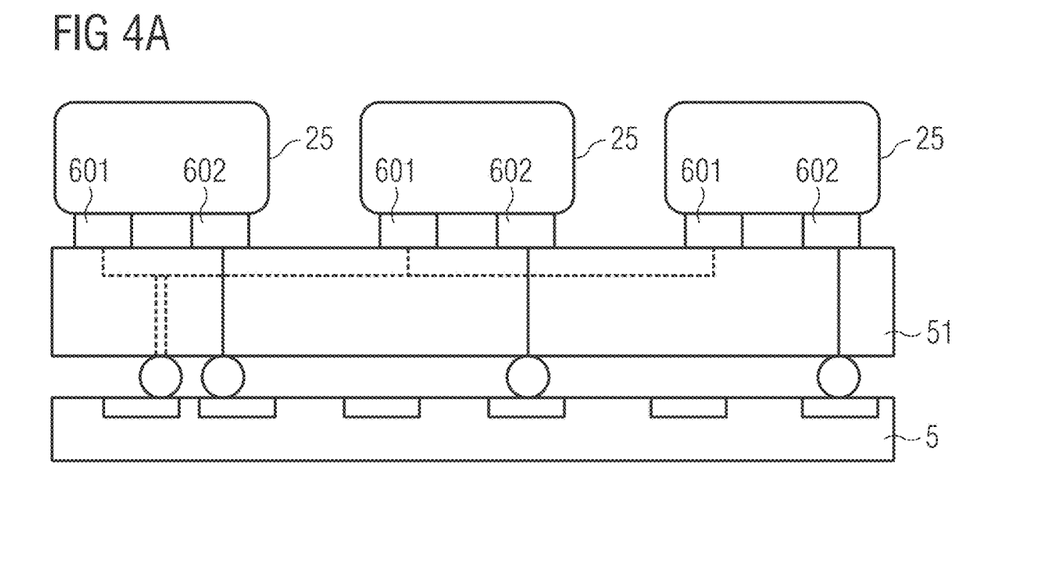
FIGS. 4A and 4B show schematic sectional views of a light emitting element and a drive device which are part of an illumination device.

FIG. 4A shows a schematic sectional view of a light emitting element 20, a contact structure 51 and a drive device 5 as they can be used in an example of an illumination device described here. The light emitting element 20 comprises several semiconductor chips 25. The semiconductor chips 25 are formed by separately manufactured semiconductor structures which can be configured to generate light L of different wavelength ranges. The light emitting element 20 is mechanically and electrically connected to the drive device 5 by means of a contact structure 51. In particular, the electrical contacts 601, 602 of the individual semiconductor chips 25 are electrically conductively connected to the drive device 5 by means of the contact structure 51. In particular, each semiconductor chip 25 has a first contact 601 which is connected to the drive device 5 via a common electrical line of the contact structure 51. A second contact 602 of each semiconductor chip 25 is used to operate these contacts separately.

Figure 4B:
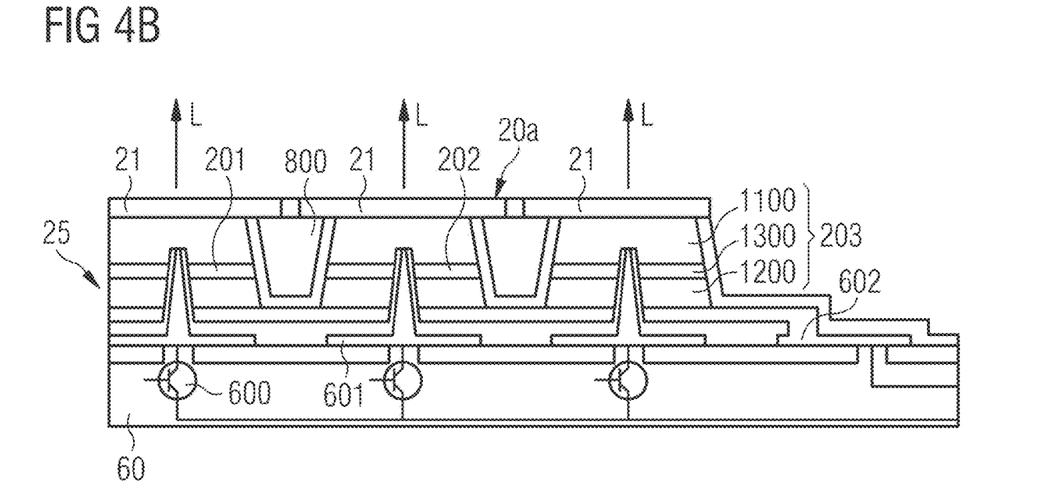

FIG. 4B shows a schematic sectional view of a light emitting element 20 described here and a drive device 60 as they can be used in an example of an illumination device described here. The light emitting element 20 comprises a first type 201 light emitting region, a second type 202 light emitting region and a third type 203 light emitting region. Each light emitting region is formed with a first conductive region 1100, a second conductive region 1200 and an active zone 1300. In normal operation, the light emitting regions are supplied with current via the first conductive region 1100 and via the second conductive region 1200, so that light is generated in the active zone 1300. In particular, the light emitting regions 201, 202, 203 emit light L through the side facing away from the drive circuit 50 during intended operation. The individual light emitting regions 201, 202 and 203, for example, are manufactured using a common manufacturing process and have the same material composition and layer structure. In particular, light L of the same color location is generated in the active zones 1300 of light emitting regions of different types 201, 202, 203.

The light emitting element 20 is mechanically connected to the drive device 60. In particular, the drive device 5 is formed with a semiconductor material and connected to the light emitting element 20 by means of a bonding method or a soldering method. For example, the drive device 60 and the light emitting element 20 are cohesively connected to each other, so that the connection can only be released by destroying the element 20 or the drive device 60. The drive device 60 comprises a plurality of transistors 600 which can be used to control the individual light emitting regions of the light emitting element 20. In particular, each light emitting region 201, 202, 203 is electrically connected to a transistor 600 via a first contact 601. The drive device 60 also has a second contact 602, by means of which all light emitting regions of the light emitting element 20 are electrically conductively contacted.

Conversion materials 210, 220, 230 are arranged on the side of the light emitting regions 201, 202, 203 facing away from the drive device 5. In particular, a first conversion material 210 is subordinate to the light emitting region of first type 201 in the radiation direction, a second conversion material 220 is subordinate to the light emitting region of second type 202 in the radiation direction and a third conversion material 230 is subordinate to the light emitting region of third type 203 in the radiation direction. For example, conversion materials 210, 220, 230 are configured to convert the light L generated in the active zone 1300 of each light emitting region 201, 202, 203 at least partially into light L of another wavelength range. In particular, first 210, second 220 and third conversion materials 230 are configured to convert light generated in the light emitting regions of different types 201, 202, 203 into light of different wavelength ranges.

The first conductive region 1100, the second conductive region 1200 and the active zone 1300 of different light emitting regions are completely separated by separating trenches 800. For example, the separation trenches are produced using a lithographic process or a laser cutting process.

Figure 5A:
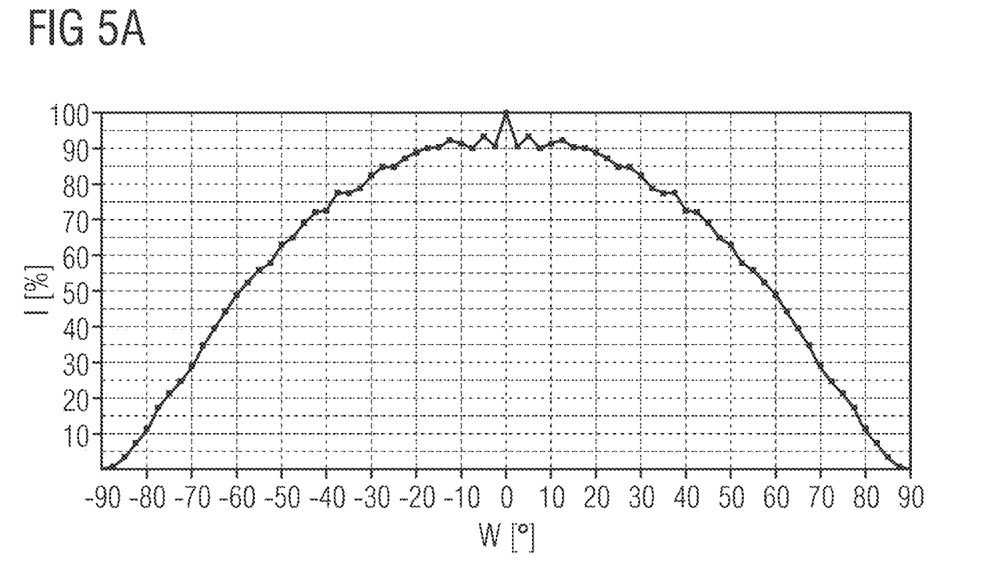
FIGS. 5A and 5B show schematically the intensity of the emitted electromagnetic radiation as a function of its exit angle from the semiconductor chip of an illumination device.
Figure 5B:
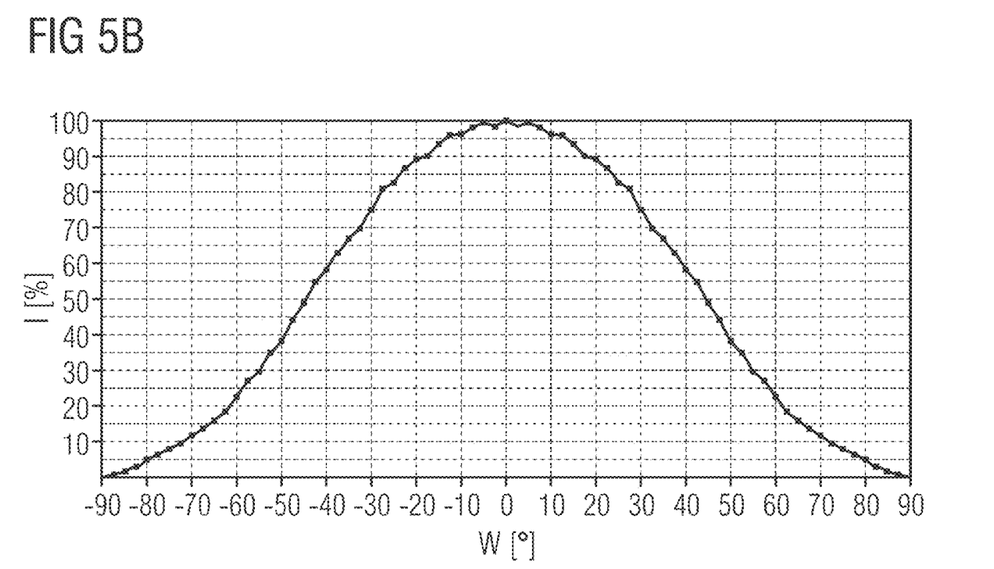

Both the graph shown in FIG. 5A and the graph shown in FIG. 5B show the intensity distribution of a light emitting element 20 with a subordinate conversion material 21. FIGS. 5A and 5B each show a graph of the relative intensity I of the electromagnetic radiation L emitted by the semiconductor chip 25 as a function of the exit angle W of the electromagnetic radiation L from the semiconductor chip of an illumination device. The exit angle W is measured relative to the radiation direction A, in particular relative to the main radiation direction.

In the active zone 1300 of the semiconductor chip 25, the intensity distribution of which is shown in FIGS. 5A and 5B, blue electromagnetic radiation, for example, is generated during normal operation and this is partially converted by means of a conversion material 21 so that the light emitting element 20 emits white electromagnetic radiation L. For example, the conversion material 21 has an average thickness of 20 μm. In particular, the color location of the emitted electromagnetic radiation L is adjusted by means of the thickness of the conversion material so that the white electromagnetic radiation L has a Cy value of 0.35 in a CIE standard color system.

FIG. 5A describes an example of the intensity curve of a light emitting element 20 as described in connection with FIG. 3D. FIG. 5B describes the intensity curve of a light emitting element 20, as described, for example, in FIG. 3E. The emission surface 30a of the light emitting element 20, whose intensity curve is shown in FIG. 5A, is formed by the conversion material 21. The light emitting element 20, whose intensity curve is shown in FIG. 5B, additionally comprises a dielectric layer structure 22, which is arranged on the conversion material 21.

For an exit angle W with an absolute value of less than 30°, the course of the relative intensity I in FIGS. 5A and 5B is essentially identical. At an exit angle W with an absolute value between 30° and 90° the relative intensity I of the light emitting element 20 shown in FIG. 5B decreases more strongly than the relative intensity I of the light emitting element 20 shown in FIG. 5A.

Figure 5C:
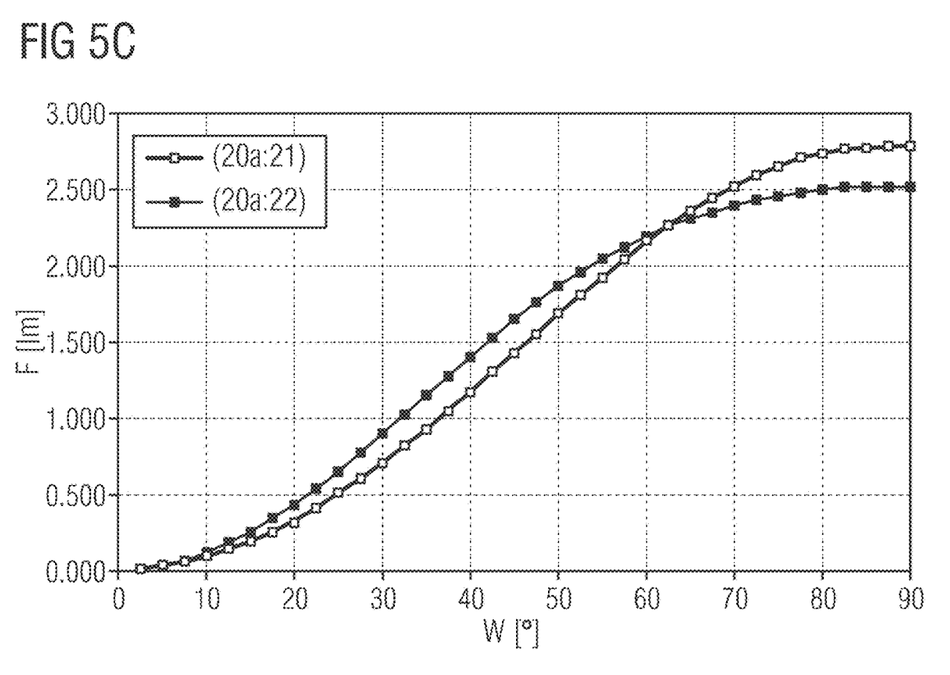
FIG. 5C shows schematically the cumulative luminous flux of the emitted electromagnetic radiation as a function of the exit angle from the semiconductor chip of an illumination device.

The effect of the dielectric layer structure 22 on the luminous flux F (unit: lumen [lm]) as a function of the exit angle W is shown in FIG. 5C. The curve 20a:21 describes the luminous flux F of a light emitting element 20 as shown in FIG. 3D, for example. In particular, the emission surface 20a is formed with the conversion material 21, so that electromagnetic radiation L emitted by the light emitting element 20 exits through an outer surface of the conversion material 21. The curve 20a:22 describes the luminous flux F of a light emitting element 20, as shown in FIG. 3E, for example. In particular, the radiating surface 20a is formed by the dielectric layer structure 22, so that electromagnetic radiation L emitted by the light emitting element 20 passes through an outer surface of the dielectric layer stack 22.

At an exit angle W between 0° and 60°, the cumulative luminous flux F of a light emitting element 20 with a dielectric layer structure 22 is greater than the cumulative luminous flux F of a light emitting element 20 without a dielectric layer structure 22. At exit angles W between 60° and 90°, the cumulative luminous flux F of a light emitting element 20 with a dielectric layer structure 22 is less than the cumulative luminous flux F of a light emitting element 20 without a dielectric layer structure 22.

The dielectric layer structure 22 forms a Bragg mirror which is configured to reflect electromagnetic radiation L as a function of its exit angle W from the semiconductor chip 25. As the exit angle W increases, the reflectivity of the dielectric layer structure 22 increases. Advantageously, the dielectric layer structure 22 increases the accumulated luminous flux F for exit angles W smaller than 60° and decreases it for exit angles W larger than 60°. In other words, the dielectric layer structure 22 increases the proportion of emitted electromagnetic radiation L with an exit angle W of less than 60°. Furthermore, the dielectric layer structure 22 reduces the proportion of emitted electromagnetic radiation L with an exit angle W of more than 60°.

Figure 6:
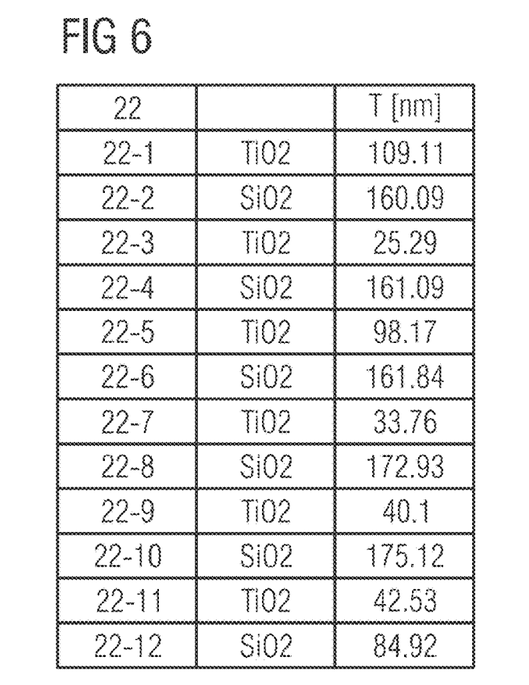
FIG. 6 show a tabular representation of the layer thickness and the material of dielectric layers of a dielectric layer structure of a semiconductor chip.

FIG. 6 shows an exemplary structure of a dielectric layer structure 22 listed in a tabular form. The dielectric layer structure 22 comprises plurality of dielectric layers 22-1 to 22-12. In the left column the individual layers 22-$i$ ($i=1 \ldots 12$) of the dielectric layer structure 22 are listed. In the middle column the material with which the layers 22-$i$ are formed is listed. In the right column, the respective layer thickness T of the individual layers 22-$i$ is listed in nanometers.

The layer structure 22 comprises twelve dielectric layers 22-$i$. The dielectric layers 22-$i$ are formed alternately with silicon dioxide ($SiO_2$) and titanium dioxide ($TiO_2$). The layers 22-$i$ each have a thickness between 40 nm and 180 nm.

The invention is not restricted to the exemplary embodiments by the description on the basis of said exemplary embodiments. Rather, the invention encompasses any new feature and also any combination of features, which in particular comprises any combination of features in the patent claims and any combination of features in the exemplary embodiments, even if this feature or this combination itself is not explicitly specified in the patent claims or exemplary embodiments.

The invention claimed is:

1. An illumination device comprising:
   a light emitting element; and
   an optical device with a first lens and a second lens,
   wherein the light emitting element has an emission surface on a side facing the optical device,
   wherein the optical device is subordinated to the light emitting element in a radiation direction,
   wherein the first lens is arranged on a side of the optical device facing the light emitting element,
   wherein a material, which has a refractive index different from a material of the first lens, is arranged between the first lens and the light emitting element,
   wherein a first surface of the first lens facing the light emitting element has a radius of curvature of at least 200 mm and a second surface of the first lens facing away from the light emitting element has a radius of curvature of at least 200 mm, and
   wherein the first lens has a thickness of at least twice an edge length of the emission surface.

2. The illumination device according to claim 1, wherein the material of the first lens comprises a refractive index of at least 1.6.

3. The Illumination device according to claim 1, wherein the material of the first lens has an Abbe number of at most 50.

4. The illumination device according to claim 1, wherein the optical device is configured to generate a spherical aberration, and wherein the optical device is configured to compensate the spherical aberration by a beam offset along an optical axis of the optical device due to a thickness of the first lens.

5. The illumination device according to claim 1, wherein at least one of the first surface or the second surface is plane.

6. The illumination device according to claim 5, wherein the first and second surfaces are parallel to each other.

7. The illumination device according to claim 1, wherein an angle between a main beam and an optical axis is at most 2° on the side of the optical device on which the light emitting element is arranged.

8. The illumination device according to claim 1, wherein a numerical aperture of the optical device is at least 0.5.

9. The illumination device according to claim 1, wherein a distance between the emission surface and the first surface is at most a length of the edge length of the emission surface.

10. The illumination device according to claim 1,
wherein the second lens is arranged on a side of the optical device facing away from the light emitting element, and
wherein a material of the second lens comprises an Abbe number of greater than 55.

11. The illumination device according to claim 1,
wherein the light emitting element is arranged in a housing, and
wherein the housing and the first lens are mechanically fixedly connected to each other.

12. The illumination device according to claim 1, wherein a gaseous material is disposed between the emission surface and the first surface.

13. The illumination device according to claim 1, wherein the first lens has an anti-reflection layer on at least one of the first surface or the second surface.

14. The illumination device according to claim 1, wherein the first lens is at least partially coated with an absorption layer.

15. The illumination device according to claim 1, wherein the light emitting element comprises a pixelated light emitting semiconductor chip or a plurality of light emitting semiconductor chips.

16. The illumination device according to claim 1, wherein the light emitting element is cohesively connected to a drive device.

17. The illumination device according to claim 1, wherein the emission surface comprises a dielectric layer structure.

18. A method for manufacturing an illumination device, the method comprising:
providing light emitting elements, wherein each light emitting element has an emission surface with an edge length;
arranging each light emitting element in a housing of a first composite of housings;
providing a plurality of first lenses in a second composite, wherein each first lens has a thickness, which is, perpendicular to a main extension plane of the first composite, at least twice as large of the edge length of the emission surface;
cohesively connecting the first and second composites with each other;
separating the housings and the first lenses, wherein, after the separation, exactly one lens with a thickness and one housing are assigned to each light emitting element, and wherein the first lens forms at least a part of a side of an optical device facing the emission surface; and
arranging a second lens in a radiation direction of the light emitting elements.

19. An illumination device comprising:
a light emitting element; and
an optical device with a first lens,
wherein the optical device is subordinated to the light emitting element in a radiation direction,
wherein the first lens is arranged on a side of the optical device facing the light emitting element,
wherein a material, which has a refractive index different from a material of the first lens, is arranged between the first lens and the light emitting element,
wherein a first surface of the first lens facing the light emitting element has a radius of curvature of at least 200 mm and a second surface of the first lens facing away from the light emitting element has a radius of curvature of at least 200 mm,
wherein a spherical aberration occurs in the optical device during operation of the illumination device, and
wherein due to a thickness of the first lens, a beam offset along an optical axis of the optical device compensates the spherical aberration of the optical device.

20. The illumination device according to claim 19, wherein at least one of the first surface or the second surface is plane.

* * * * *